United States Patent
Tien

(10) Patent No.: US 7,358,695 B2
(45) Date of Patent: Apr. 15, 2008

(54) METHOD FOR CONTROLLING FAN

(75) Inventor: Chi-Wei Tien, Taipei (TW)

(73) Assignee: Compal Electronics, Inc., Taipei (TW)

( * ) Notice: Subject to any disclaimer, the term of this patent is extended or adjusted under 35 U.S.C. 154(b) by 0 days.

(21) Appl. No.: 11/309,306

(22) Filed: Jul. 25, 2006

(65) Prior Publication Data

US 2007/0075663 A1 Apr. 5, 2007

(30) Foreign Application Priority Data

Jan. 11, 2006 (TW) ............... 95101035 A

(51) Int. Cl.
*H02P 1/00* (2006.01)
*H02P 1/22* (2006.01)
*H02P 1/40* (2006.01)
*H02P 3/00* (2006.01)
*H02P 3/20* (2006.01)

(52) U.S. Cl. ............... 318/268; 318/59; 318/257

(58) Field of Classification Search ............ None
See application file for complete search history.

(56) References Cited

U.S. PATENT DOCUMENTS 6,757,592 B1 * 6/2004 Henderson et al. ......... 700/299
6,935,130 B2 * 8/2005 Cheng et al. ............... 62/259.2

* cited by examiner

*Primary Examiner*—Jeffrey Donels
*Assistant Examiner*—Erick Glass
(74) *Attorney, Agent, or Firm*—Jianq Chyun IP Office

(57) ABSTRACT

A method for controlling a fan is provided for adjusting the rotational speed of a fan. The method includes adjusting the rotational speed of the fan from a first mode value to a range of rotational speed variation, wherein the upper bound of the range of rotational speed variation is a second mode value plus a first variation value, and the lower bound of the range of rotational speed variation is the second mode value minus a second variation value; and adjusting the rotational speed of the fan in the range of rotational speed variation during a time period. Thus, a user will not consider the sound from the fan as a noise.

19 Claims, 4 Drawing Sheets

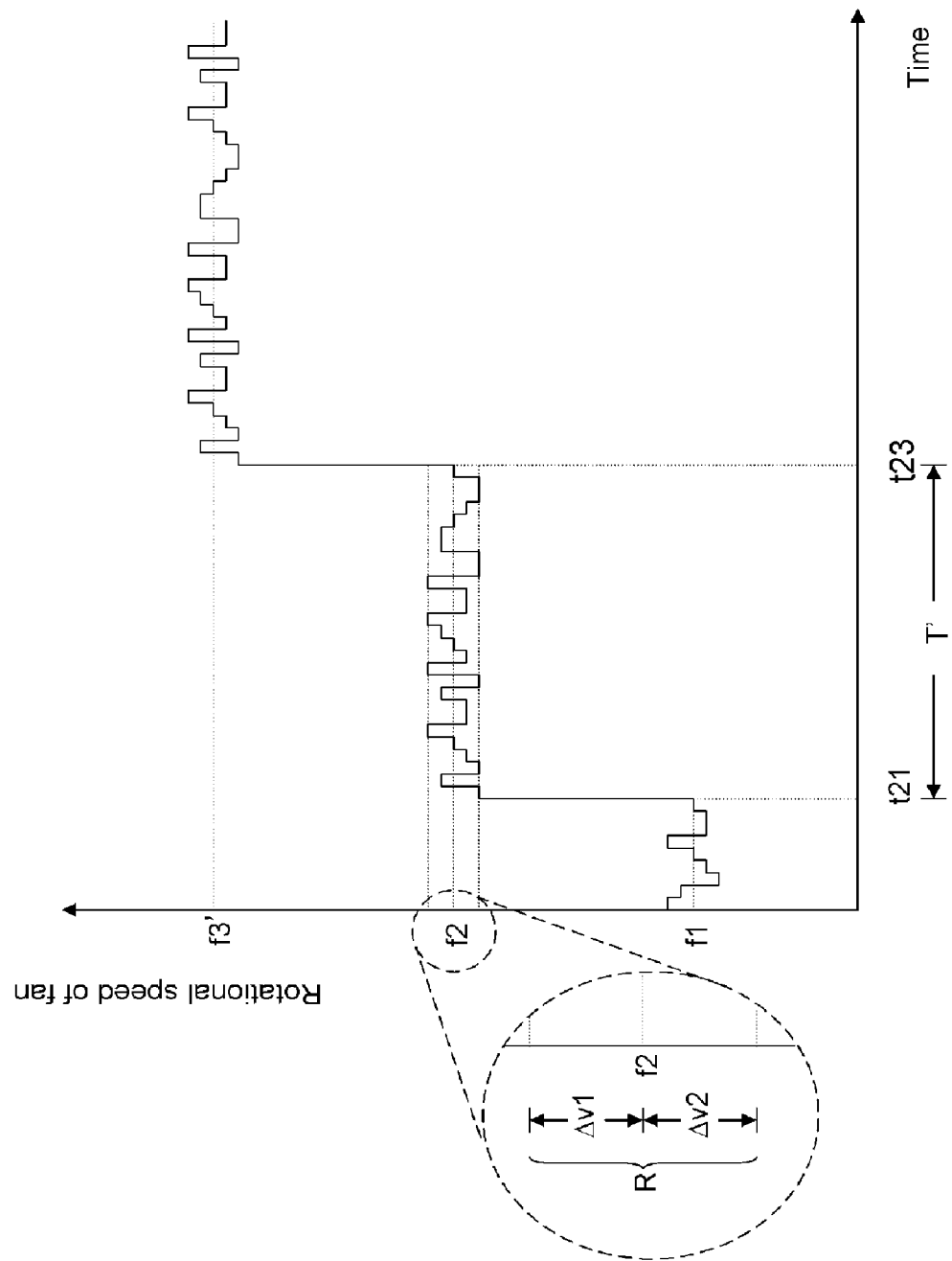

METHOD FOR CONTROLLING FAN

CROSS-REFERENCE TO RELATED APPLICATION

This application claims the priority benefit of Taiwan application serial no. 95101035, filed on Jan. 11, 2006. All disclosure of the Taiwan application is incorporated herein by reference.

BACKGROUND OF THE INVENTION

1. Field of Invention

The present invention relates to a controlling method, and more particularly to a method for controlling a fan.

2. Description of Related Art

Along with the progress in science and technology, electronic devices such as notebooks or desk-top computers have been widely used. In general, to prevent the waste heat generated by the electronic devices during operations from affecting the performance thereof, fans are usually disposed to dissipate the waste heat. Further, the current techniques can flexibly adjust the heat dissipation rate via directly modulating the rotational speed of the fan by software programs according to the temperature of the electronic devices.

FIG. 1 is a schematic view of a conventional method for controlling the rotational speed of a fan, wherein the horizontal coordinate represents time and the vertical coordinate represents the rotational speed of the fan. Referring to FIG. 1, the fan has low speed, intermediate speed and high speed mode values for rotational speed, which respectively correspond to 2000, 3000 and 4000 rpm. The rotational speed of the fan is determined by the input voltage of the fan. At first, the fan is rotated at a rotational speed of low speed mode value (2000 rpm), and at a time point t11, the rotational speed of the fan is adjusted to the intermediate speed mode value (3000 rpm) for raising the waste heat dissipation rate. After that, at a time point t13, the rotational speed of the fan is adjusted to the high speed mode value (4000 rpm) for dissipating the waste heat at a full speed. The requirements of heat dissipation at different time periods can be satisfied by adjusting the rotational speed of the fan.

In view of the above, the fan sounds in operation. When the fan rotates faster and faster, the decibel (dB) and frequency of the sound from the fan also become higher. Seen from acoustics researches, human considers a continuous single pure tone as a noise. Therefore, as the rotational speed of the fan remains for a period of time at the low speed, intermediate speed and high speed mode values respectively, the sound made by the fan in each of the modes is a continuous single pure tone and thus is considered as a noise by the user. More particularly, when the fan rotates faster, the sound of a high dB and high frequency made by the fan may be considered as a greater noise by the user.

Therefore, when the rotational speed of the fan is switched, for example, at the time point t11, the rotational speed of the fan is adjusted from the low speed mode value to the intermediate speed mode value, the dB and frequency of the single pure tone (noise) made by the fan are changed. As such, the user may feel sick by sensing the noise. Especially, during the period from t11 to t12, the user is still paying attention to the single pure tone (noise) after the mode switch, so the user may have a worse feeling for the noise.

SUMMARY OF THE INVENTION

Accordingly, an objective of the present invention is to provide a method for controlling a fan, such that the user may not sense a noise.

To fulfill the above or other objectives, the present invention provides a method for controlling a fan, which is applicable to adjust the rotational speed of a fan. The method comprises adjusting the rotational speed of the fan from a first mode value to a range of rotational speed variation, wherein the upper bound of the range of rotational speed variation is a second mode value plus a first variation value, and the lower bound of the range of rotational speed variation is the second mode value minus a second variation value; and adjusting the rotational speed of the fan in the range of rotational speed variation during a time period.

In the method for controlling a fan according to an embodiment of the present invention, the above-mentioned first variation value equals to the second variation value.

In the method for controlling a fan according to an embodiment of the present invention, the above-mentioned first variation value is a first variation preset value, a first variation random value or a first variation operational value.

In the method for controlling a fan according to an embodiment of the present invention, the above-mentioned second variation value is a second variation preset value, a second variation random value or a second variation operational value.

In the method for controlling a fan according to an embodiment of the present invention, the above-mentioned first mode value is not in the range of rotational speed variation or is 0.

In the method for controlling a fan according to an embodiment of the present invention, the length of the above-mentioned time period is a time preset value, a time random value or a time operational value.

The method for controlling a fan according to an embodiment of the present invention further comprises adjusting the rotational speed of the fan from the range of rotational speed variation to a third mode value after the rotational speed of the fan is adjusted in the range of rotational speed variation during a time period.

In the method for controlling a fan according to an embodiment of the present invention, the time period can be divided into a plurality of time sections according to the adjusting times of the rotational speed of the fan in the range of rotational speed variation, and the lengths of the time sections are determined by a time section preset value, a time section random value or a time section operational value.

In the method for controlling a fan according to an embodiment of the present invention, the above-mentioned rotational speed of the third mode value is the second mode value.

In the method for controlling a fan according to an embodiment of the present invention, the above-mentioned rotational speed of the third mode value is not in the range of rotational speed variation or is 0.

In the method for controlling a fan according to an embodiment of the present invention, the step of adjusting the rotational speed of the fan comprises adjusting the rotational speed of the fan by modulating the voltage provided for the fan.

In the method for controlling a fan according to an embodiment of the present invention, the above-mentioned first variation preset value, second variation preset value, time preset value and time section preset value are set in advance.

In the method for controlling a fan according to an embodiment of the present invention, the above-mentioned first variation random value, second variation random value, time random value and time section random value are values in a random table.

In the method for controlling a fan according to an embodiment of the present invention, the above-mentioned first variation operational value, second variation operational value, time operational value and time section operational value are calculated by formulas together with random parameters.

In view of the above, in the method for controlling a fan according to the present invention, the sound made by the fan is no longer a continuous single pure tone, but a characteristic sound with fluctuant audio frequencies. As such, the user may not consider the sound from the fan as a noise.

In order to make the aforementioned and other objectives, features and advantages of the present invention comprehensible, preferred embodiments accompanied with figures are described in detail below.

BRIEF DESCRIPTION OF THE DRAWINGS

FIG. 3B is a schematic view of another method for controlling the rotational speed of a fan according to the flow in FIG. 2.

DESCRIPTION OF EMBODIMENTS

Generally, a fan has a rotational speed of a plurality of mode values (such as the above-mentioned low speed, intermediate speed and high speed mode values). The rotational speed of the fan can be adjusted by modulating the input voltage of the fan according to the system temperature of the fan, such that the fan can dissipate heat at an optimal efficiency. However, when the rotational speed of the fan is switched between any two mode values, the user may sense the change in the sound of the fan, but when the sound made by the fan is a single pure tone, the user may have a strong sense that the fan is making a noise.

To solve the above problem, the present invention controls the rotational speed of a fan by software, such that the sound made by the fan during the switch of the mode value is no longer a continuous single pure tone, but a characteristic sound with fluctuant audio frequencies. As a result, the user may not consider the sound from the fan as a noise. To give a clear illustration, the state of the fan during the switch of the mode value is described in detail below.

Figure 1:
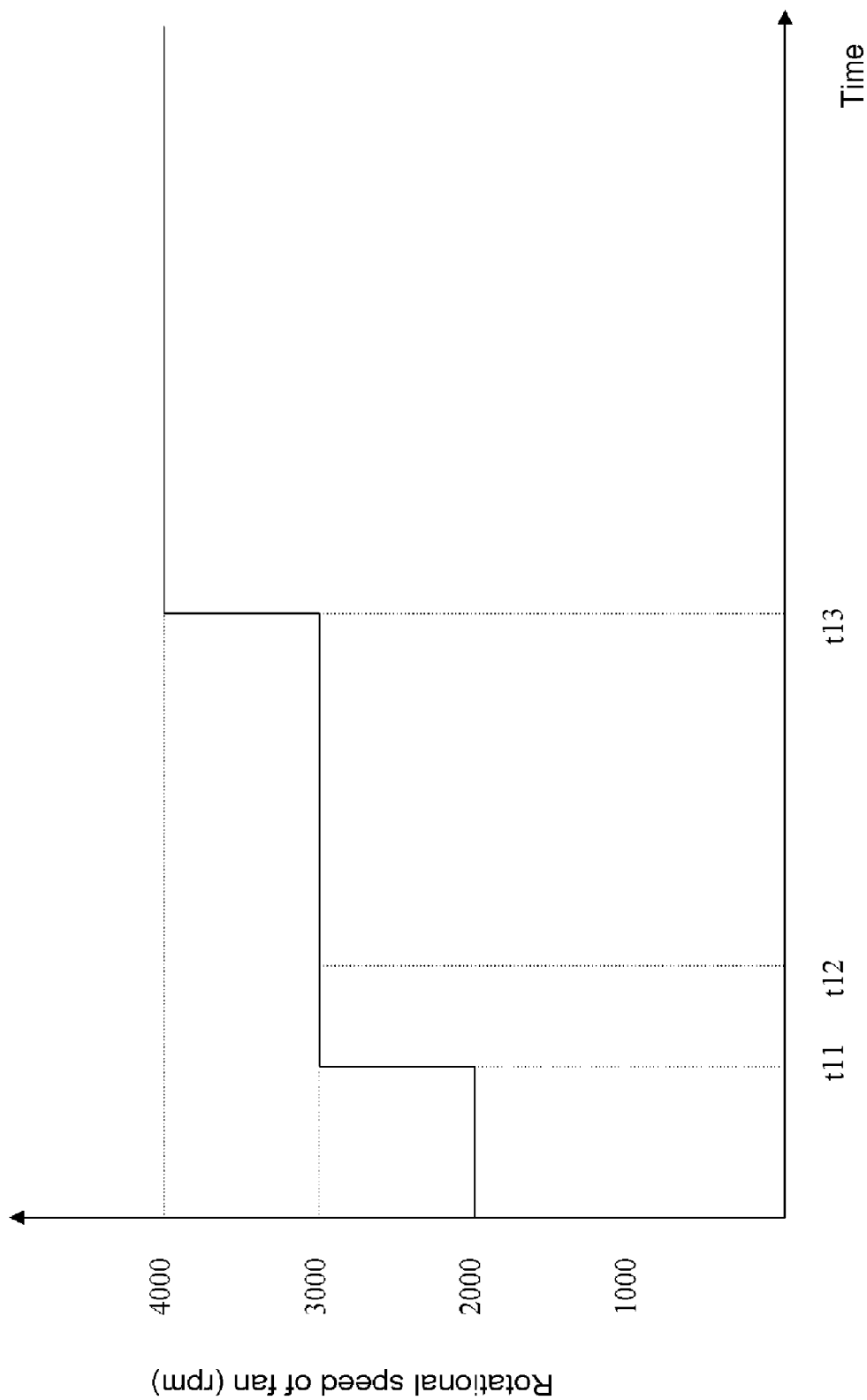
FIG. 1 is a schematic view of a conventional method for controlling the rotational speed of a fan.
Figure 2:
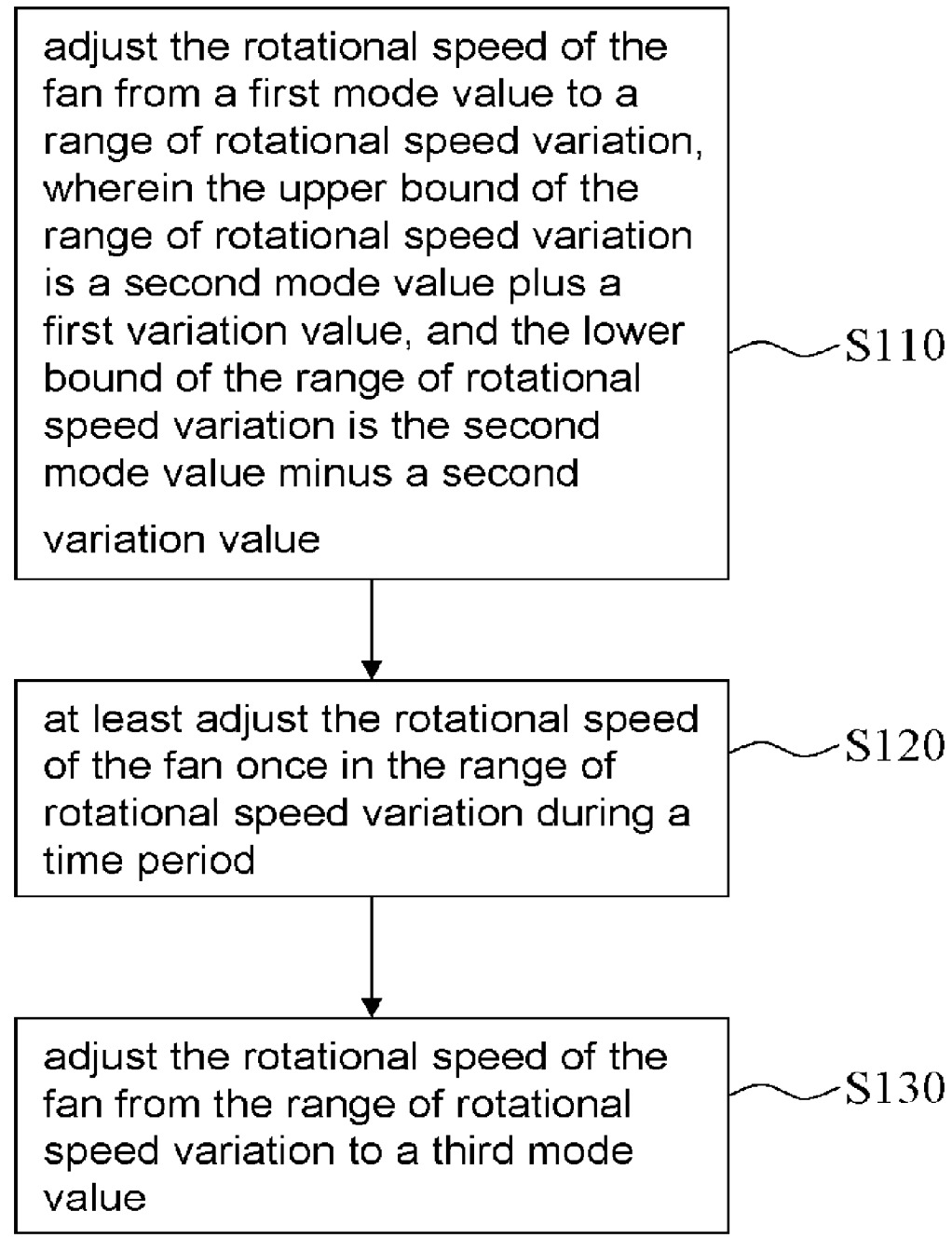
FIG. 2 is a flow chart of a method for controlling a fan according to an embodiment of the present invention.
Figure 3A:
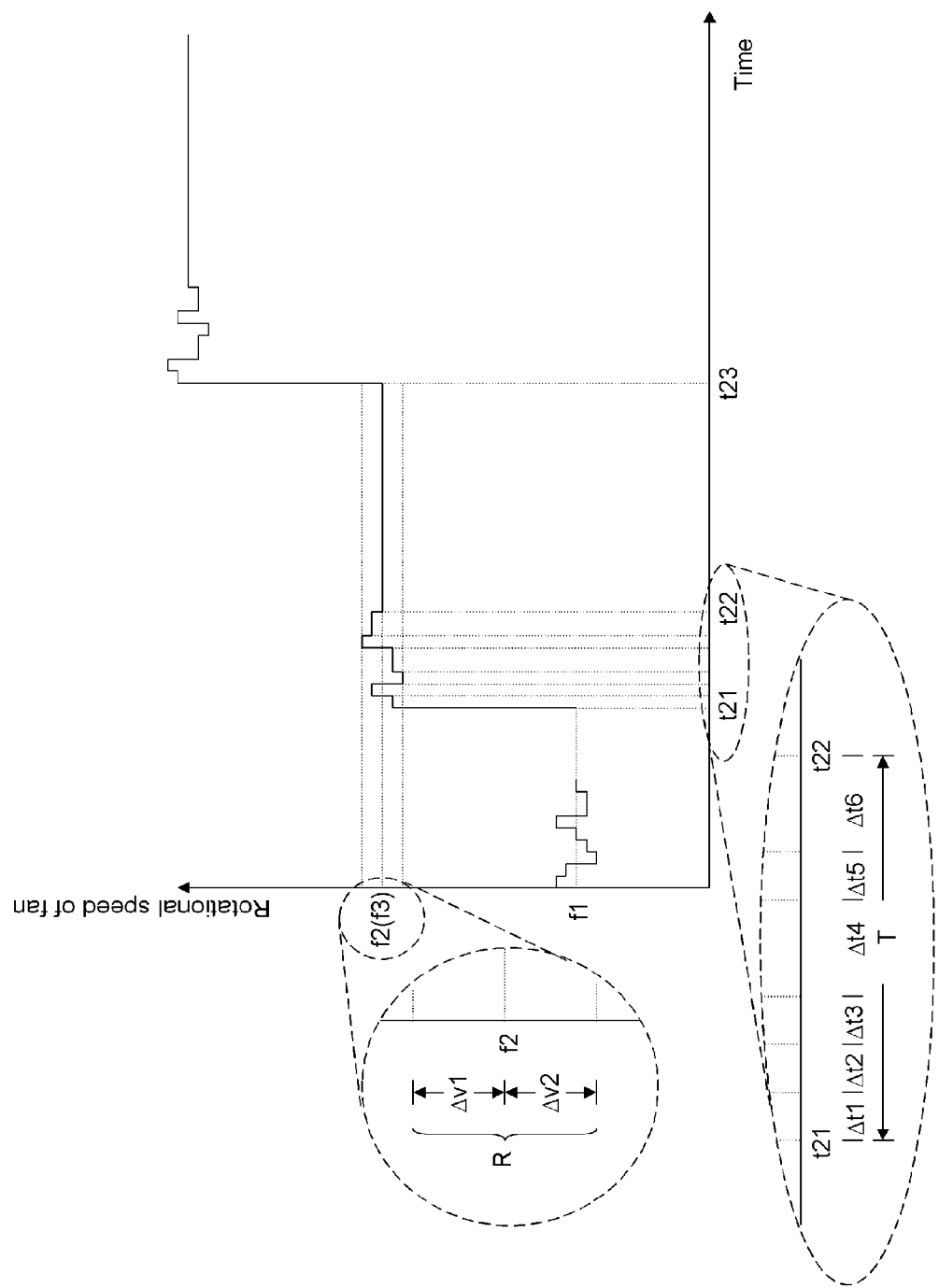
FIG. 3A is a schematic view of a method for controlling the rotational speed of a fan according to the flow in FIG. 2.

FIG. 2 is a flow chart of a method for controlling a fan according to an embodiment of the present invention, and FIG. 3A is a schematic view of a method for controlling the rotational speed of a fan according to the flow in FIG. 2, wherein the horizontal coordinate represents time and the vertical coordinate represents the rotational speed of the fan. Referring to FIGS. 2 and 3A, the method for controlling a fan of the present invention is suitable for adjusting the rotational speed of the fan. The method includes the following steps. First, as shown by Step S110, the rotational speed of the fan is adjusted from a first mode value f1 to a range of rotational speed variation R, wherein the upper bound of the range of rotational speed variation R is a second mode value f2 plus a first variation value $\Delta v1$, and the lower bound of the range of rotational speed variation R is the second mode value f2 minus a second variation value $\Delta v2$.

In particular, at a time point t21, the rotational speed of the fan is adjusted from the first mode value f1 to the second mode value f2, so as to adjust the heat dissipation rate of the fan. The present invention takes the second mode value f2 as a reference value, and the second mode value f2 plus the first variation value $\Delta v1$ and minus the second variation value $\Delta v2$ respectively is used as the range of rotational speed variation R. Moreover, the rotational speed of the fan can be adjusted from the first mode value f1 to any value in the range of rotational speed variation R.

Then, according to Step S120, the rotational speed of the fan is adjusted in the range of rotational speed variation R during a time period T. As the rotational speed of the fan is changed, the audio frequency of the sound made by the fan is also changed. Thus, the user senses a sound with changes in the audio frequency and may not consider the sound as a noise. Therefore, the problem of the user sensing a noise can be solved. In the present embodiment, the rotational speed of the fan is adjusted several times in the time period T, so as to ensure that the user may not consider the sound from the fan as a noise.

Referring to FIG. 3A, the first variation value $\Delta v1$ can be a first variation preset value, a first variation random value or a first variation operational value. The first variation preset value is a value set in advance, and the first variation random value is a value in a random table. To obtain various first variation values $\Delta v$, the first variation operational value can be calculated by formulas together with random parameters. Moreover, the second variation value $\Delta v2$ can be a second variation preset value, a second variation random value or a second variation operational value. The second variation preset value is a value set in advance, and the second variation random value is a value in a random table. To obtain various second variation values $\Delta v$, the second variation operational value can also be calculated by formulas together with random parameters. In the present embodiment, the first variation value $\Delta v1$ equals to the second variation value $\Delta v2$. Of course, in other embodiments, the first variation value can differ from the second variation value. Moreover, when the first variation value $\Delta v1$ is the first variation random value or the first variation operational value, or when the second variation value $\Delta v2$ is the second variation random value or the second variation operational value, the first variation value $\Delta v1$ and the second variation value $\Delta v2$ may have different variations, such that the range of rotational speed variation R is changed irregularly. Therefore, the user may sense a sound with more changes in the audio frequency during the time period T.

In view of the above, the first variation value $\Delta v1$ and the second variation value $\Delta v2$ have no limitations in the present invention, i.e., the range of rotational speed variation R is not limited, however, in the present embodiment, the range of rotational speed variation R does not include mode values other than the second mode value f2 (for example, the first mode value f1). Therefore, on the premise that the user may not sense a noise, the fan can still reach a heat dissipation rate similar to the operation with the second mode value f2.

In other words, the first mode value f1, for example, is not in the range of rotational speed variation R. Further, as the stationary fan starts to rotate, the first mode value f1 is 0.

Referring to FIG. 3A again, the present invention divides the time period T into a plurality of time sections Δt (Δt1, Δt2, Δt3 . . . ) according to the adjusting times of the rotational speed of the fan in the range of rotational speed variation R. The length of the time period T is, for example, a time preset value, a time random value or a time operational value, wherein the time preset value is a value set in advance and the time random value is a value in a random table. To obtain various time periods T, the time operational value can be calculated by formulas together with random parameters. The lengths of the time sections Δt (Δt1, Δt2, Δt3 . . . ) are determined by a time section preset value, a time section random value or a time section operational value. The time section preset value is a value set in advance, and the time section random value is a value in a random table. To obtain various time sections Δt, the time section operational value can be calculated by formulas together with random parameters. By the way, the present embodiment divides the time period T into six time sections Δt (Δt1~Δt6), and the number of the time section Δt is not limited in the present invention. Therefore, when the time period T is the time random value or the time operational value, or when the time section Δt is the time section random value or the time section operational value, the values of the time period T and time section Δt are various, such that the adjusting times is irregular, thus making the user sense a sound with more changes in the audio frequency.

Referring to FIGS. 2 and 3A at the same time, as shown by Step S130, the rotational speed of the fan is adjusted from the range of rotational speed variation R to a third mode value f3, and in the present embodiment, the third mode value f3 equals to the second mode value f2, so as to maintain a constant rotational speed of the fan. In particular, the rotational speed of the fan is adjusted from the range of rotational speed variation R to the third mode value f3 at a time point t22.

In view of the above, when the state of the system in which the fan is allocated is changed, the rotational speed of the fan must be adjusted to provide an appropriate heat dissipation rate, so Steps S110~S130 are repeated to achieve the purpose. In the present embodiment, the Step S110 is repeated at a time point t23, which can be easily deduced by those skilled in the art and thus will not be described in detail herein. Moreover, to further prevent the user from sensing a noise, the present invention continuously adjusts the rotational speed of the fan in the period from t21 to t23. The following part will give an illustration via other embodiments with reference to the drawings.

FIG. 3B is a schematic view of another method for controlling the rotational speed of a fan according to the flow in FIG. 2, wherein the horizontal coordinate represents time and the vertical coordinate represents the rotational speed of the fan. Referring to FIGS. 2 and 3B, the method for controlling a fan of the present embodiment is similar to that of the above embodiments, and the difference is that the rotational speed of the fan is adjusted from the range of rotational speed variation R to a third mode value f3' after being adjusted in the range of rotational speed variation R during a time period T', wherein the third mode value f3' is not in the range of rotational speed variation R. Further, as the fan in operation has to be stopped, the third mode value f3' is 0.

In view of the above, the method for controlling a fan of the present invention at least has the following advantages.

1. During the switch in mode values of the rotational speed, the fan makes no single pure tone but a characteristic sound with fluctuant audio frequencies. As such, the user senses a sound with changes in the audio frequency without considering the sound as a noise. Additionally, the fan can also make a characteristic sound with fluctuant audio frequencies in operation, so as to further prevent the user from sensing a noise.

2. The present method can directly adjust the rotational speed of the fan by modulating the input voltage of the fan by software, so there is no need to make extra variations to the fan.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims.

What is claimed is:

1. A method for controlling a fan, applicable for adjusting the rotational speed of a fan, the method comprising:
   adjusting the rotational speed of the fan from a first mode value to a range of rotational speed variation, wherein an upper bound of the range of rotational speed variation is a second mode value plus a first variation value, and a lower bound of the range of rotational speed variation is the second mode value minus a second variation value;
   adjusting the rotational speed of the fan in the range of rotational speed variation during a time period; and
   adjusting the rotational speed of the fan from the range of rotational speed variation to a third mode value after being adjusted in the range of rotational speed variation during the time period.

2. The method for controlling a fan according to claim 1, wherein the first variation value equals to the second variation value.

3. The method for controlling a fan according to claim 1, wherein the first variation value is a first variation preset value set in advance.

4. The method for controlling a fan according to claim 1, wherein the first variation value is a first variation random value in a random table.

5. The method for controlling a fan according to claim 1, wherein the first variation value is a first variation operational value, calculated by formulas together with random parameters.

6. The method for controlling a fan according to claim 1, wherein the second variation value is a second variation preset value set in advance.

7. The method for controlling a fan according to claim 1, wherein the second variation value is a second variation random value in a random table.

8. The method for controlling a fan according to claim 1, wherein the second variation value is a second variation operational value, calculated by formulas together with random parameters.

9. The method for controlling a fan according to claim 1, wherein the first mode value is not in the range of rotational speed variation or is 0.

10. The method for controlling a fan according to claim 1, wherein the length of the time period is a time preset value set in advance.

11. The method for controlling a fan according to claim 1, wherein the length of the time period is a time random value in a random table.

12. The method for controlling a fan according to claim 1, wherein the length of the time period is a time operational value, calculated by formulas together with random parameters.

13. The method for controlling a fan according to claim 1, wherein the time period is divided into a plurality of time sections according to the adjusting times of the rotational speed of the fan in the range of rotational speed variation, and the lengths of the time sections are determined by a time section preset value, a time section random value or a time section operational value.

14. The method for controlling a fan according to claim 13, wherein the time section preset value is a value set in advance.

15. The method for controlling a fan according to claim 13, wherein the time section random value is a value in a random table.

16. The method for controlling a fan according to claim 13, wherein the time section operational value is calculated by formulas together with random parameters.

17. The method for controlling a fan according to claim 1, wherein the rotational speed of the third mode value is the second mode value.

18. The method for controlling a fan according to claim 1, wherein the rotational speed of the third mode value is not in the range of rotational speed variation or is 0.

19. The method for controlling a fan according to claim 1, wherein the step of adjusting the rotational speed of the fan comprises adjusting the rotational speed of the fan by modulating the voltage provided for the fan.

* * * * *